United States Patent [19]

Fugere et al.

[11] Patent Number: 5,798,663

[45] Date of Patent: Aug. 25, 1998

[54] PRECISION HYSTERESIS GENERATOR

[75] Inventors: Robert H. Fugere, North Providence; James Alvernaz, West Greenwich, both of R.I.

[73] Assignee: Cherry Semiconductor Corporation, East Greenwich, R.I.

[21] Appl. No.: 697,328

[22] Filed: Aug. 22, 1996

Related U.S. Application Data

[60] Provisional application No. 60/004,640 Sep. 29, 1995.

[51] Int. Cl.$^6$ .................................................. H03K 3/037
[52] U.S. Cl. ............................................. 327/205; 327/74
[58] Field of Search ..................................... 327/205, 206, 327/68, 72, 73, 74, 77, 87, 88

[56] References Cited

U.S. PATENT DOCUMENTS

| | | | |
|---|---|---|---|
| 4,384,219 | 5/1983 | Davis | 327/80 |
| 4,775,807 | 10/1988 | Bukowski, Jr. | 327/72 |
| 4,926,068 | 5/1990 | Fujita | 327/205 |
| 5,264,740 | 11/1993 | Wright | 307/355 |
| 5,313,114 | 5/1994 | Poletto et al. | 327/205 |
| 5,361,175 | 11/1994 | Richardson et al. | 360/46 |
| 5,519,548 | 5/1996 | Liepe et al. | 360/65 |
| 5,610,545 | 3/1997 | Jenkins et al. | 327/205 |

OTHER PUBLICATIONS

Horowitz et al., "The Art of Electronics," Cambridge University Press, published 1980, p. 102.

*Primary Examiner*—Toan Tran
*Attorney, Agent, or Firm*—Bromberg & Sunstein LLP

[57] ABSTRACT

A hysteresis generator for providing a comparator with a precision hysteresis reference input. An output of the comparator controls a switch which determines whether or not a reference current is applied to a resistor. The resistor is connected between a reference voltage and an input to the comparator. A buffer amplifier provides the reference voltage to the resistor. The reference current is taken from a second resistor connected between the output of the buffer amplifier and the input of a current mirror. The current mirror applies its output current to the first resistor. A diode may be inserted between the output of the buffer amplifier and the first resistor to make the hysteresis voltage generated by the current applied to the first resistor substantially temperature independent.

16 Claims, 3 Drawing Sheets

PRECISION HYSTERESIS GENERATOR

PRECISION HYSTERESIS GENERATOR

BACKGROUND OF THE INVENTION

The present application claims priority from U.S. provisional application No. 60/004,640, filed Sep. 29, 1995.

The present invention relates to a circuit for providing a precision hysteretic difference voltage in a hysteretic comparator.

Hysteretic comparators are used to create a voltage margin about a reference voltage threshold level in order to desensitize the comparator response to noise or to other variations in signal which are not intended to trigger a change in the output state of the comparator. While a hysteretic comparator will be triggered to change state when the signal voltage approaches and crosses the original threshold voltage from below, the signal must then fall to a second and lower threshold voltage before the comparator output will change back to its first state.

It is desirable, in some applications, to fix the hysteresis difference voltage precisely, as when working with low-level signals, in order to guarantee a particular level of noise immunity. Precise determination of the hysteresis voltage is particularly important when the value of the hysteresis voltage is small. In that case, sensitivity to the precise value of the saturation voltage of a switch or to a change with temperature in the value of any component is undesirable.

One method of generating a hysteretic difference voltage is shown in FIG. 1. According to this method, an output of the comparator is used to switch a transistor, the collector-emitter circuit of which shunts a portion of a voltage divider. The voltage divider applies a reference voltage to the comparator. When the transistor switch is switched on, the saturation voltage of the transistor contributes to the reference voltage. The difference between the reference voltage with the transistor switch on and the switch off is referred to as the hysteresis voltage. Since the value of the saturation voltage of the transistor switch is unpredictable and subject to variation with temperature, the hysteresis voltage is, consequently, also unpredictable.

Referring more particularly to FIG. 1, a typical prior art hysteresis generator is indicated generally by reference character 10. Operation of comparator 12 causes output 16 and auxiliary output 14 of comparator 12 to be switched to a high state when signal voltage V2 exceeds a reference voltage Vref applied to inverting input 18 of comparator 12. Auxiliary output 14 is at the same polarity as output 16 of comparator 12, but output 16 and auxiliary output 14 are electrically isolated. Reference voltage Vref is determined by voltage V1 and a voltage divider formed by resistors R1–R3. Vref assumes an initial reference voltage equal to V1 times the ratio of the sum of R2 and R3 to the total resistance of the chain of R1–R3. When auxiliary output 14 is switched to a high state, it causes transistor switch Q1 to conduct, thereby providing a shunt path for current to bypass resistor R3. Reference voltage Vref is thereby reduced since resistor R3 no longer contributes to the voltage divider. The disadvantage of this prior art method is that saturation voltage Vsat across transistor Q1 contributes to reference voltage Vref, and is both unpredictable and affected by temperature. Consequently, reference voltage Vref cannot be determined precisely.

SUMMARY OF THE INVENTION

In accordance with an embodiment of the present invention, a hysteresis generator circuit is provided which varies the threshold reference voltage of a comparator depending upon whether the output state of the comparator is high or low. The comparator has a first input and a second input and an output having a high state and a low state. A resistor is coupled to the first input of the comparator. An initial reference voltage is provided at the end of the resistor distal to the first input of the comparator. A switch controlled by the state of the comparator selectively applies a reference current to the resistor so that the first input of the comparator is at the reference voltage when no current is applied to the resistor and and to reference voltage minus a hysteresis voltage determined by the reference current and the resistor when the reference current is applied to the resistor.

The reference voltage may be provided to the resistor by a buffer amplifier. A second resistor may be connected to the output of the buffer amplifier to provide a current related to the reference voltage. The current from the second resistor is provided to a current mirror and mirrored into the resistor coupled to the first input of the comparator to create the hysteresis voltage. A diode may be inserted between the output of the buffer amplifier and the first resistor to make the hysteresis voltage relative to the reference voltage substantially temperature independent.

The hysteresis generator circuit described herein modifies the conventional hysteresis generator by providing a hysteretic difference voltage which is substantially independent of saturation voltages or temperature induced effects. The hysteresis generator circuit described herein advantageously provides the capability to accurately program a small value of difference voltage which depends only on the ratio of two resistances. It is suited for use in integrated circuits and is tolerant of manufacturing variations in component values. Other objects and advantages of the invention are in part apparent and in part pointed out hereinafter.

DETAILED DESCRIPTION OF THE PREFERRED EMBODIMENTS

Figure 1:
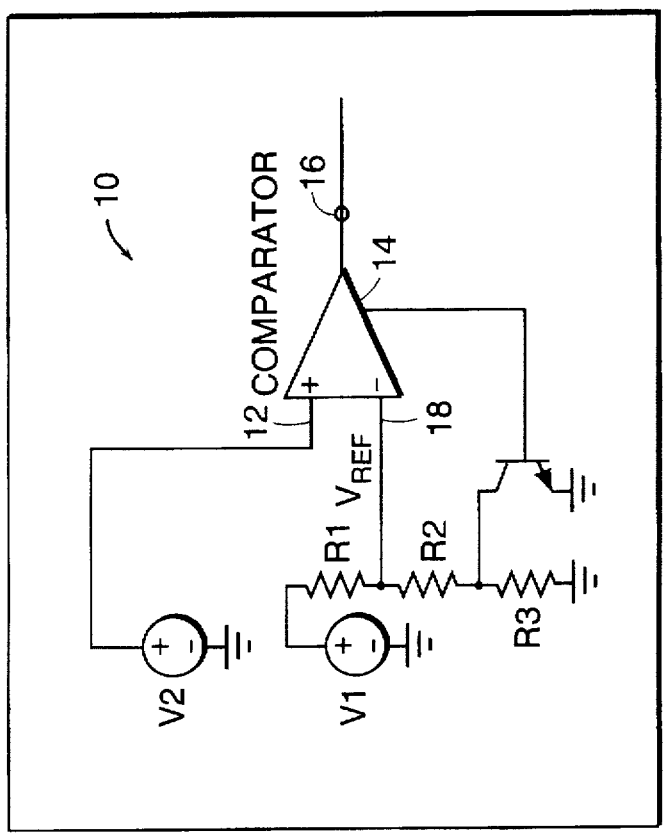
FIG. 1 is a circuit diagram of a prior art hysteresis generator.
Figure 2:
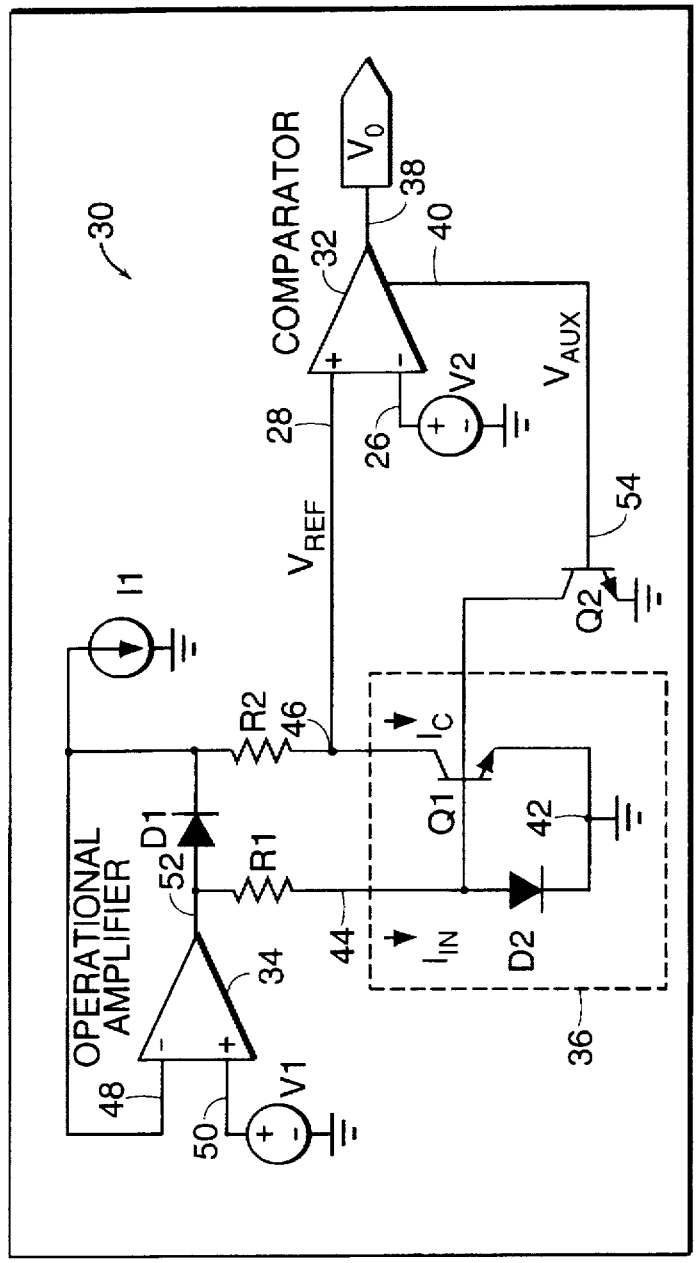
FIG. 2 is a circuit diagram of a hysteresis generator constructed in accordance with the present invention.

A presently preferred embodiment of the present invention is described with reference to FIG. 2. A hysteresis generator 30 is implemented, in the preferred embodiment, as a portion or entirety of an integrated circuit (not shown), and provides a comparator 32, a buffer amplifier 34, and a current mirror 36, interconnected as hereinafter described. It is to be understood that electrical polarities are given as conventionally practiced in the art, but that reversal of polarities along with the inclusion of pnp bipolar transistors instead of npn bipolar transistors is within the ordinary level of skill in the art.

In the preferred embodiment, comparator 32 provides a voltage at a switched output 38 which is in one of two states. Switched output 38 is either in a 'high' state, or else switched output 38 is in a 'low' state. The state of switched output 38 is determined by the relative voltages applied to comparator 32 at a first input 26 and at a second input 28. In particular, the voltage applied at first input 26 is a signal voltage V2, while the voltage applied at second input 28 is a reference voltage Vref. When signal voltage V2 exceeds reference voltage Vref, switched output voltage Vo is low, otherwise, switched output voltage Vo is high. Auxiliary output voltage Vaux, of equal polarity to switched output voltage Vo, appears at auxiliary output 40 which is internally isolated from switched output 38 so that the hysteresis generator 30 is isolated from subsequent output circuitry (not shown).

Reference voltage Vref is not constant but depends on the state of switched output 38. In particular, when the state of switched output 38 is high, hysteresis generator 30 provides for Vref to equal input voltage V1. In contrast, when the state of switched output 38 is low, Vref drops to a value which is less than input voltage V1 by an amount referred to as the hysteresis voltage. In order to provide for Vref to equal input voltage V1 when the state of switched output 38 is high, the second input 28 of comparator 32 is coupled through series resistor R2 to inverting input 48 of buffer amplifier 34. While buffer amplifier 34 may be realized in other ways, buffer amplifier 34 is realized in the preferred embodiment by an operational amplifier with noninverting input 50 connected to receive input voltage V1. Inverting input 48 is maintained at the same potential as noninverting input 50 through operation of operational amplifier 34, since output 52 of operational amplifier 34 is fed back to inverting input 48 through diode D1. A small current I1 is sunk between inverting input 48 and ground to ensure proper operation of operational amplifier 34. Therefore, in the absence of current flowing through series resistor R2, Vref equals input voltage V1.

The second input 28 of comparator 32 is additionally coupled to an output terminal 46 of current mirror 36. Current mirror 36 is a three-port circuit element which provides for current Ic between a grounded port 42 and output terminal 46. The output current equals a multiple of an input current $I_{in}$ flowing between grounded port 42 and input terminal 44. While current mirror 36 can be realized in other ways, current mirror 36 is realized, in the preferred embodiment, by a transistor Q1 and a diode D2, the emitter and cathode of which, respectively, are grounded. If transistor Q1 conducts, then collector current Ic of transistor Q1 flows through resistor R2. The collector current Ic is equal in value, by operation of current mirror 36, to a multiple of input current $I_{in}$ flowing through diode D2 between terminal 44 and grounded port 42. While the multiple of input current $I_{in}$ constituted by collector current Ic may be any predetermined factor, it is unity in the preferred embodiment and will be referred to as such in the following description.

Auxiliary output 40 is connected to base terminal 54 of transistor switch Q2 so that when the state of auxiliary output voltage Vaux is high, transistor switch Q2 conducts, switching terminal 44 of current mirror 36 to ground. No collector current Ic flows through resistor R2 and Vref equals input voltage V1.

On the other hand, when the state of auxiliary output voltage Vaux is low, transistor switch Q2 does not conduct. Then, collector current Ic, equal to input current $I_{in}$, flows through resistor R2, reducing reference voltage Vref by the product of collector current Ic times the resistance of resistor R2. In the preferred embodiment, input current $I_{in}$ is derived by coupling terminal 44 of current mirror 36 to output 52 of operational amplifier 34 through a series resistor R1. The presence of diode D1 in the feedback loop between output 52 and inverting input 48 of operational amplifier 34 provides compensation against temperature induced effects upon the voltage across diode D2. In particular, input current $I_{in}$ equals $|V1+V(D1)-V(D2)|/R1$, where V(D1) and V(D2) are the voltages across diodes D1 and D2, respectively. To a high degree of precision, V(D1) equals V(D2), so that $I_{in}$ equals V1/R1, and the hysteresis voltage, by which reference voltage Vref is reduced when the state of auxiliary output voltage Vaux is low, is V1*R2/R1. The hysteresis voltage, therefore, for a given input voltage V1, depends only on the ratio of two circuit resistances which is more accurately determinable in the manufacturing process than individual resistances.

Figure 3:
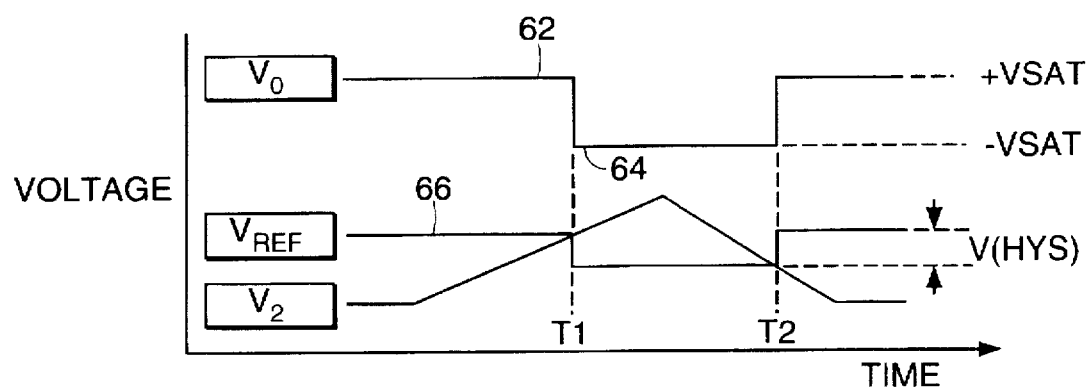
FIG. 3 is an illustration of voltage levels characterizing the operation of the present invention.

The operation of hysteresis generator 30 is now described with reference to FIG. 3 which shows the time-evolution of switched output voltage Vo and reference voltage Vref as signal voltage V2 crosses reference voltage Vref in a rising sense, at time T1, and in a falling sense, at time T2. Switched output voltage Vo is always in one of two states: a 'high' state 62 or a 'low' state 64. In high state 62, switched output voltage Vo is substantially at positive supply voltage Vsat. In low state 64, switched output voltage Vo is brought down to the negative supply voltage -Vsat or ground, depending upon the supply configuration of the integrated circuit in a particular application. The conditions causing switched output voltage Vo to switch states are shown with reference to signal voltage V2 and reference voltage Vref. Prior to time T1, signal voltage V2 is less than reference voltage Vref, which, in this portion 66 of the cycle, equals V1. After time T1, signal voltage V2 exceeds reference voltage Vref, causing switched output voltage Vo to drop to low state 64, and concurrently reducing reference voltage Vref by a hysteresis voltage V(HYS), which is precisely determined, as described above, through choice of resistors R1 and R2 (shown in FIG. 2). Switched output voltage Vo remains in low state 64, until signal voltage V2 falls below Vref at time T2. Then switched output voltage Vo returns to high state 62, and reference voltage Vref returns to its original value.

The described embodiments of the inventions are intended to be merely exemplary and numerous variations and modifications will be apparent to those skilled in the art. All such variations and modifications are intended to be within the scope of the present invention as defined in the appended claims.

We claim:

1. A hysteresis generator comprising:
   a comparator having a first input and a second input and an output having a high state and a low state;
   a first resistor having a first and a second end, the first end of said first resistor being coupled to the first input of the comparator;
   a reference voltage connected to the second end of said first resistor;
   a switch controlled by the state of said comparator for selectively applying a reference current that is a function of said reference voltage through said first resistor so that the first input of said comparator is at said reference voltage when no current is applied through said first resistor and is at said reference voltage minus a hysteresis voltage determined by the reference current and said first resistor when the reference current is applied through said first resistor;
   a current mirror having an input circuit, the input circuit being switched to ground by said switch when the output of the comparator is in a high state, and having an output circuit for supplying current through said first resistor;
   an amplifier having a first input for receiving a voltage, a second input connected to the second end of said first resistor and an output; and
   a diode having an anode connected to the output of said amplifier and a cathode connected to the second end of said first resistor so that said reference voltage is maintained by said amplifier at the voltage of the first input of said amplifier in the absence of a reference current flowing through said first resistor; and a second resistor connected between the output of said amplifier and an input of said current mirror such that the input current to said current mirror comes from said second resistor.

2. A hysteresis generator comprising:

a comparator having a first input and a second input and an output having a high state and a low state;

a resistor having a first end and second end, the first end of said resistor being coupled to the first input of the comparator, the second end of said resistor being coupled to the cathode of a diode;

a buffer amplifier having an input for receiving an input voltage and an output applied to the anode of the diode for establishing an initial reference voltage at the second end of said resistor;

a current mirror having an input coupled to the anode of the diode and an output coupled to the first input of the comparator such that an output current of said current mirror flows through said resistor, a hysteresis voltage being developed thereby across said resistor, and when the output current flows a net voltage is established at the first input of the comparator, said net voltage equaling an algebraic sum of the initial reference voltage and the hysteresis difference voltage; and means for selectively providing an input current to the input of the current mirror in response to the state of the output of said comparator.

3. The hysteresis generator as set forth in claim 2 wherein said buffer amplifier is an operational amplifier having an inverting input connected to the cathode of said diode and to a current path to ground.

4. The hysteresis generator as set forth in claim 2 wherein said means for selectively providing the input current to the current mirror comprises a resistor connected between the output of the buffer amplifier and the current mirror.

5. The hysteresis generator as set forth in claim 2 wherein said current mirror comprises:

a transistor, having a grounded emitter, a collector connected to said first input of the comparator, and a base; and a diode, having a grounded cathode and an anode connected to the base of the transistor.

6. The hysteresis generator as set forth in claim 2 wherein said means for switching off the output current of the current mirror is a transistor switch having a base connected to the output of the comparator, a grounded emitter, and a collector coupled to the current mirror.

7. The hysteresis generator as set forth in claim 2 wherein said comparator further includes an auxiliary output for providing an auxiliary voltage for switching off the output current of the current mirror.

8. The hysteresis generator as set forth in claim 7 wherein said means for switching off the output current of the current mirror is a transistor switch having a base connected to the auxiliary output of the comparator, a grounded emitter, and a collector coupled to the current mirror.

9. A hysteresis generator comprising:

a comparator having a first input and a second input and an output having a high state and a low state;

a first resistor having a first end and a second end, the first end of said resistor being coupled to the first input of the comparator;

a buffer amplifier having a noninverting input for receiving a reference voltage, an inverting input connected to the second end of said first resistor and an output coupled to the second end of said first resistor through a diode;

a current mirror having an input coupled to the output of the buffer amplifier and an output coupled to the first end of first resistor for applying a reference current, related to the reference voltage, through said first resistor; and a transistor switch controlled by the output of said comparator, for switching off said current mirror.

10. The hysteresis generator of claim 9, further including a second resistor connected between the output of said buffer amplifier and the input of said current mirror.

11. The hysteresis generator of claim 10 further comprising a diode connected between the output of said buffer amplifier and the second end of said first resistor.

12. A hysteresis generator comprising:

a comparator having a first input and a second input and an output having a high state and a low state;

a resistor having a first and a second end, the first end of said resistor being coupled to the first input of the comparator;

a reference voltage connected to the second end of said resistor;

means for supplying a reference current though said resistor such that the reference current is a function of said reference voltage;

a switch controlled by the state of said comparator for selectively applying the reference current through said resistor so that the first input of said comparator is at said reference voltage when no current is applied trough said resistor and is at said reference voltage minus a hysteresis voltage, the hysteresis voltage being determined by the reference current and said resistor when the reference current is applied through said resistor; and means coupled to the reference current supply means for compensating temperatures variations in the reference current supplying means such that the function of said reference voltage is a substantially temperature independent function.

13. A method for providing a hysteretic difference voltage for a comparator having an output, the output having a high state and low state; the comparator having a series resistor coupled to a reference input port and a reference voltage coupled to the reference input port through said series resistor, the method comprising:

applying the reference voltage to a shunt resistor so as to develop a reference current through the shunt resistor; and selectively applying a current proportional to the reference current through the series resistor to create the hysteretic difference voltage.

14. A hysteresis generator comprising:

a comparator having a first input and a second input and an output having a high state and low state;

a first resistor having a first and a second end, the first end of said first resistor being coupled to the first input of the comparator;

a reference voltage coupled to the second end of said first resistor; and a second resistor coupled between the reference voltage and ground for developing a reference current determined by the reference voltage; and a switch controlled by the state of said comparator for selectively applying a proportional current proportional to the reference current through the first resistor to create a hysteretic difference voltage.

15. The hysteresis generator of claim 14 further comprising a current mirror receiving the reference current at an input and producing the proportional current at an output.

16. The hysteresis generator of claim 14 further comprising:

an amplifier having a first input for receiving a voltage, a second input connected to the second end of said first resistor and an output; and a diode having an anode connected to the output of said amplifier and a cathode connected to the second end of said first resistor so that said reference voltage is maintained by said amplifier at the voltage of the first input of said amplifier in the absence of the proportional current flowing through said first resistor.

* * * * *